United States Patent [19]
Russell

[11] 3,947,865
[45] Mar. 30, 1976

[54] COLLECTOR-UP SEMICONDUCTOR CIRCUIT STRUCTURE FOR BINARY LOGIC

[75] Inventor: Lewis K. Russell, San Jose, Calif.

[73] Assignee: Signetics Corporation, Sunnyvale, Calif.

[22] Filed: Oct. 7, 1974

[21] Appl. No.: 512,919

[52] U.S. Cl. .................. 357/46; 307/303; 307/215; 307/218; 357/51; 357/44
[51] Int. Cl.² H01L 27/02; H03K 3/26; H03K 19/34; H03K 19/22
[58] Field of Search ........ 357/46, 51; 307/304, 303, 307/218, 215

[56] References Cited
UNITED STATES PATENTS

| | | |
|---|---|---|
| 3,736,477 | 5/1973 | Berger et al. .......................... 357/46 |
| 3,801,967 | 4/1974 | Berger et al. .......................... 357/46 |
| 3,811,074 | 5/1974 | Suzuki et al. .......................... 357/46 |
| 3,823,353 | 7/1974 | Berger et al. .......................... 357/46 |
| 3,866,066 | 2/1975 | Pedersen ................................ 357/46 |
| 3,872,495 | 3/1975 | Geller et al. .......................... 357/46 |
| 3,879,745 | 4/1975 | Tharmaratnam ...................... 357/46 |

Primary Examiner—Andrew J. James
Attorney, Agent, or Firm—C. Richard Pfeiffer; William H. Dana

[57] ABSTRACT

A collector-up binary structure of the type having spaced semiconductor regions forming a plurality of active devices for interconnection as a binary circuit is disclosed. The structure includes a semiconductor body of one conductivity having a planar surface, and spaced first, second, third and fourth transistors formed in said body. Fifth, sixth, seventh and eighth transistors are included, said fifth and sixth transistors being formed in the base regions of said second transistor and said seventh and eighth transistors being formed in the base region of said fourth transistor. Lead means provides ohmic contact to each of the respective regions of the respective transistors and interconnecting means is provided for connecting the plurality of active devices as a binary circuit. A structure further including ninth and tenth source transistors is also disclosed.

6 Claims, 6 Drawing Figures

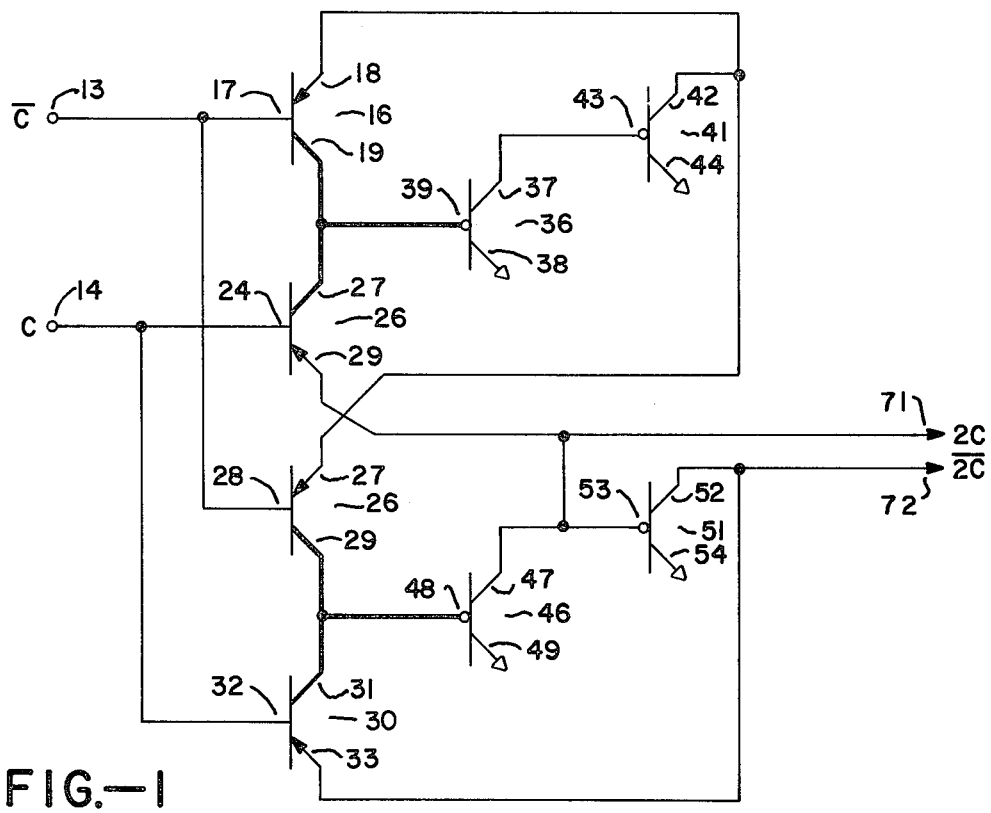
FIG.—1
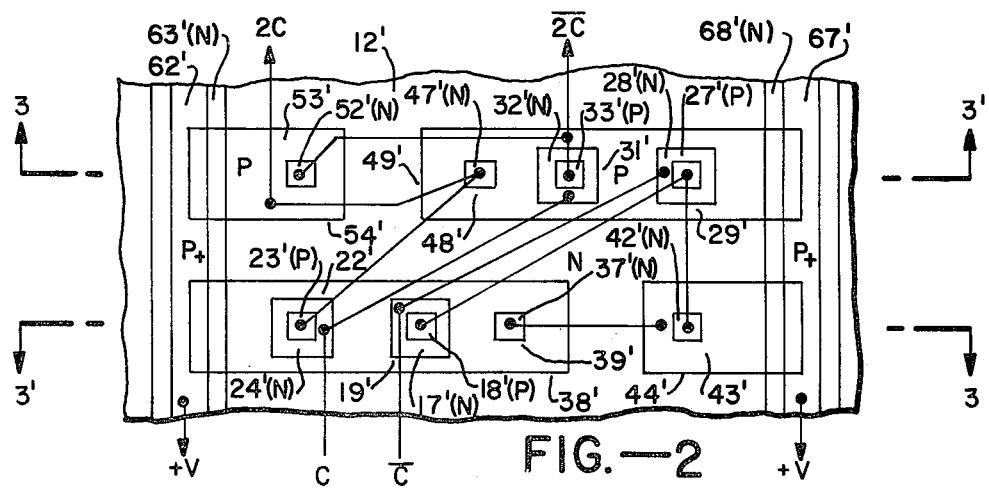
FIG.—2
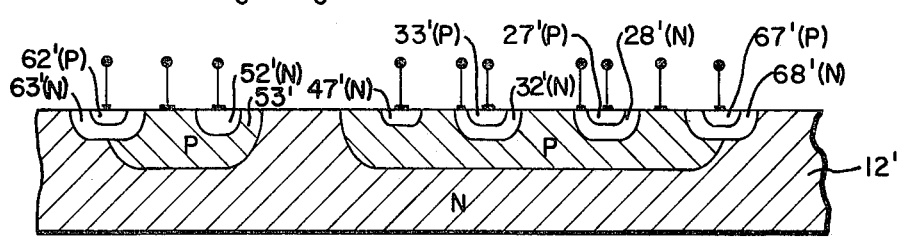
FIG.—3-3'

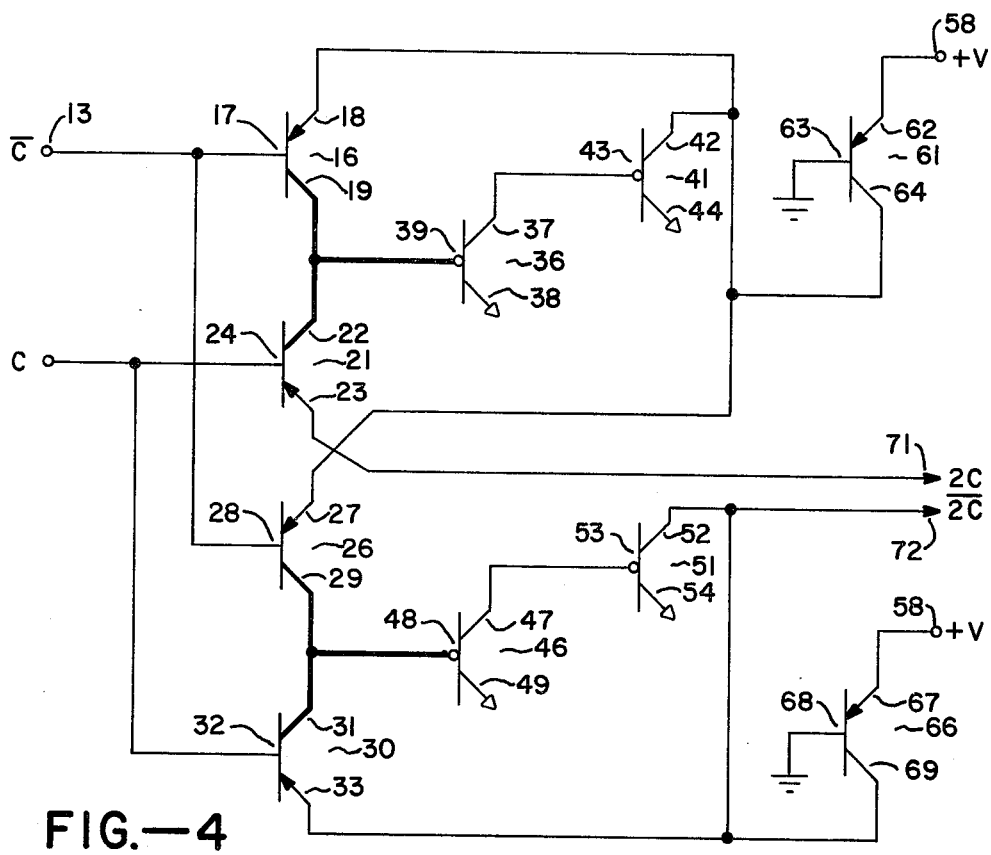
FIG.—4
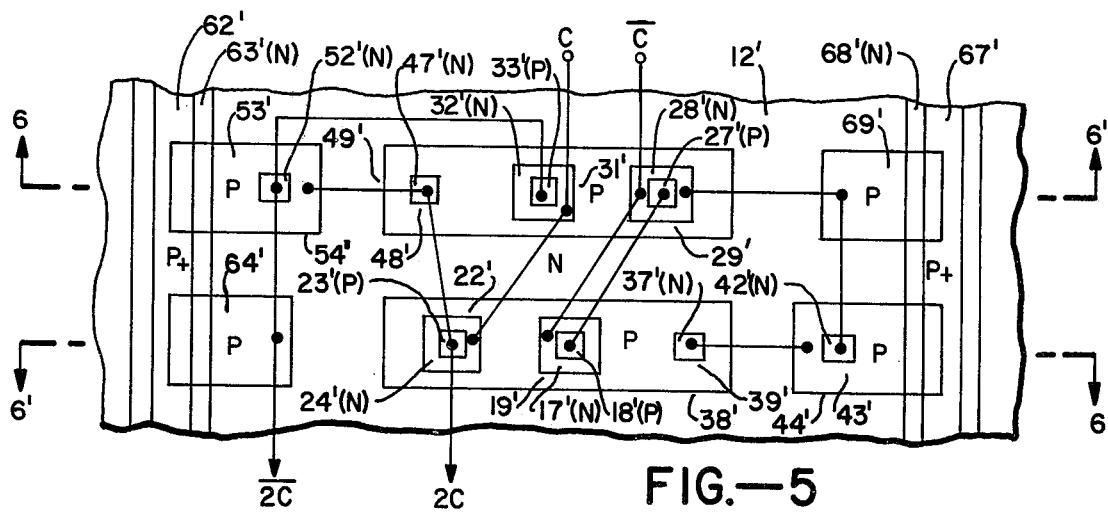
FIG.—5
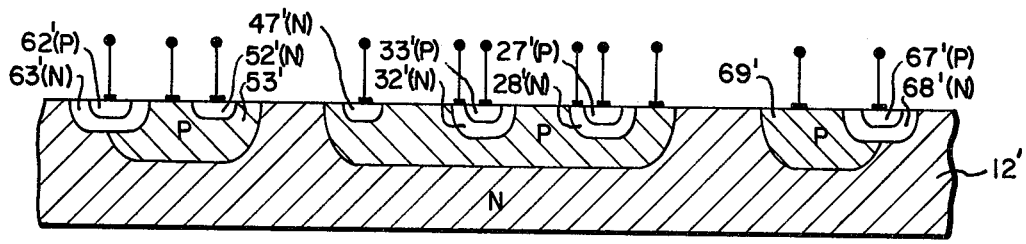
FIG.—6-6'

COLLECTOR-UP SEMICONDUCTOR CIRCUIT STRUCTURE FOR BINARY LOGIC

BACKGROUND OF THE INVENTION

This invention relates generally to a bipolar semiconductor switching structure including the combination of a plurality of switching transistors. More particularly, this invention relates to a bipolar semiconductor switching structure suitable for collector-up or integrated injection logic circuitry and the interconnection of a plurality of active devices as a binary circuit.

Although binary semiconductor switching structures have heretofore been provided, such structures have generally required excessive semiconductor area, have consumed excessive power, do not successfully combine integrated injection logic and conventional transistor circuitry and have slow operating speeds. Thus there is a need for a high performance collector-up binary structure for interconnection as a binary circuit to perform logic functions.

OBJECTS AND SUMMARY OF THE INVENTION

Accordingly, it is a general object of the present invention to provide an improved performance, collector-up logic semiconductor structure which performs binary circuit functions.

It is a particular object of the present invention to provide an improved semiconductor collector-up injection logic structure which may be formed in relatively high density arrays and which is capable of greatly improved switching speeds.

The foregoing and other objects of the invention are achieved in a collector-up binary structure of the type having spaced semiconductor regions forming a plurality of active devices suitable for interconnection as a binary circuit. The structure includes a semiconductor body of one conductivity having a planar surface and spaced first, second, third and fourth transistors formed in said body. Fifth, sixth, seventh and eighth transistors are included said fifth and sixth transistors being formed in the base region of said second transistor. The seventh and eighth transistors are formed in the base region of said fourth transistor. Lead means is provided for ohmic contact to the respective regions of each of the respective transistors. Interconnection means is provided to connect the respective regions as a binary circuit.

DESCRIPTION OF THE DRAWINGS

FIG. 1 is a schematic diagram of the semiconductor structure interconnected as a binary circuit.

FIG. 2 is a top view of a semiconductor structure showing the respective device regions interconnected as a binary circuit.

FIG. 3 is a cross-sectional view of the FIG. 2 semiconductor structure.

FIG. 4 is a schematic diagram of the semiconductor structure interconnected as a binary circuit and including additional source transistors.

FIG. 5 is a top view of the semiconductor structure interconnected to form a binary circuit.

FIG. 6 is a cross-sectional view of the FIG. 5 semiconductor structure.

DESCRIPTION OF THE PREFERRED EMBODIMENTS

A plurality of collector-up binary structures are shown in the accompanying FIGS. 1–6. Briefly, the binary structure includes integrated injection or collector-up semiconductor structures uniquely combined in an integrated circuit structure. Collector-up structures are disclosed in co-pending applications COLLECTOR-UP SEMICONDUCTOR STRUCTURE AND METHOD, Ser. No. 454,789, filed Mar. 26, 1974, invented by Lewis K. Russell and assigned to the present assignee. The collector-up structure uniquely integrates a switching transistor in combination with a source transistor which injects carriers into the switching transistor. The collector-up structure utilizes the uppermost regions formed in the semiconductor body as collector regions, hence the designation "collector-up" structures.

Collector-up binary structures have been disclosed in co-pending application COLLECTOR-UP LOGIC TRANSMISSION GATES, Ser. No. 487,756, filed July 11, 1974, invented by Lewis K. Russell and assigned to a common assignee. The binary circuit therein disclosed when implemented in a semiconductor structure occupies a substantial portion of the semiconductor body. In the present invention the binary circuit has been uniquely implemented in a semiconductor structure with a significant reduction in the required active regions and thus a reduction in the semiconductor area required.

Collector-up structures are preferred in the present invention because they may be formed in relatively high density arrays which operate at greatly reduced power levels. In a collector-up structure a relatively high gain source transistor is provided capable of efficiently injecting carriers into the base region of the switching transistor. For example, an NPN switching transistor may have an associated PNP source transistor. The source transistor may be vertically configured and provide betas from 40 to 250. A supply voltage of 0.8 volts provides logic levels of approximately 0.7 volts and 0.02 volts. Collector-up structures may be uniquely combined to form a binary semiconductor structure as will now be seen.

Referring to FIG. 1, a schematic diagram of the collector-up binary circuit is shown. Control input terminal 13 is connected to bases 17 and 28 of transistors 16 and 26 respectively, and input terminal 14 is connected to bases 24 and 32 of transistors 21 and 29 respectively. The collectors 19 and 22 of transistors 16 and 21 are connected to the input of the collector-up device 36. The connection is shown as a heavy line to indicate that the connection is physically accomplished by use of a single semiconductor region as will be seen. Collector-up device 36 is shown symbolically as a transistor having an open circle at base 39 indicating a source of injection via an associated source transistor. The emitter of the collector-up device is shown using an unshaded NPN transistor symbol, thereby indicating the conductivity of the switching transistor included in said collector-up device and further indicating that the emitter 38 is connected to the common semiconductor body or substrate. Collector-up device 36 has an equivalent circuit discussed in the previously referenced co-pending application COLLECTOR-UP SEMICONDUCTOR STRUCTURE AND METHOD, Ser. No. 454,789, filed Mar. 26, 1974. The equivalent circuit of device 36 may thus be viewed as an NPN switching transistor having a base terminal 39, an emitter 38 connected to the body and a collector 37. An additional associated source transistor may be a P-N-P transistor having an emitter connected to voltage supply means, a base connected to the semiconductor body and a collector connected to base 39 of the NPN switching transistor. Collector-up device 36 has a collector 37 connected to a base 43 of collector-up device 41. Device 41 has an emitter 44 connected to said body and a collector 42. Emitter 18 of transistor 16 and emitter 27 of transistor 26 are connected to collector 42. Collectors 29 and 31 are respective transistors 26 and 29 are connected to the base terminal 48 of collector-up device 46, said connection being via a common semiconductor structural region as will be seen. Collector-up device 46 includes an equivalent circuit as was previously discussed in conjunction with device 36, and has an emitter 49 connected to said body and a collector 47 connected to the base 53 of collector-up device 51. Collector 47 is also connected to emitter 23 of transistor 21 and to output terminal 71. Collector-up device 51 has an emitter 54 connected to said body and a collector 52 connected to output terminal 72. Emitter 33 of device 29 is connected to output terminal 72.

Referring to FIGS. 2 and 3, the top and cross-sectional views of the semiconductor binary structures are shown. The prime reference numbers correspond to the reference numbers of the FIG. 1 schematic diagram. Starting with a N conductivity body 11' plural P spaced regions 53' and the combination region including region 22', region 19' and region 39' are formed, said region 53' said combination region being formed in said body 11' extending to surface 12'. Simultaneously P region 43' and the P type combination region of regions 48', 31' and 29' are formed in body 11' extending to surface 12'.

Next N spaced regions 24', 17' and 37' are formed entirely within the first combination region including regions 22', 19' and 39' extending to surface 12'. Simultaneously N regions 32', 28' and 47' are formed in the second combination region including regions 48', 31' and 29' extending to surface 12'. At the same time, spaced substantially parallel N-type stripe regions 63' and 68' are formed in body 11' extending to substantially planar surface 12'. The regions extend laterally to overlap respective portions of regions 53' and 43', and the combination regions of (22', 19', 39') and (48', 31', 29'). Simultaneously N-type regions 52' and 42' are formed entirely within respective P-type regions 53' and 43' extending to surface 12'. Next P-type regions 23' and 18' are formed within respective regions 24' and 17' extending to surface 12'. Simultaneously P-type regions 33' and 27' are formed within regions 32' and 28' extending to surface 12'. At the same time P-type stripe source regions 62' and 67' are formed entirely within respective N-type regions 63' and 68' extending to surface 12'. P regions 62' and 67' extend laterally within the portions of respective stripe regions 63' and 68' which overlap portions of regions 53', 43', (22', 19', 39'), and (48', 31', 29').

Lead means and interconnect means is provided to contact and interconnect the various respective regions. Lead means may comprise ohmic metal contacts such as the formation of aluminum contacts with each of the respective regions, and interconnect means may comprise a patterned aluminum layer. The aluminum layer may be formed to simultaneously contact the respective regions and subsequently patterned to provide interconnection. Electrical interconnection is as previously described in conjunction with the FIG. 1 schematic diagram.

Turning to operation, an input signal having a first period T and having input C and complement $\overline{C}$ is provided at terminal 13 and 14 respectively. The signal is caused to propagate with time via the respective transistor pairs 16 and 26 and alternately 21 and 29, passing via collector-up structures 36 and 41 and alternately collector-up structures 46 and 51 to thereby provide an output signal at terminals 71 and 72 having a period 2T. Suitable voltage means for operation of the circuit may be provided by connecting first terminal of a voltage supply to stripe regions 62' and 67' and the second voltage supply terminal to the semiconductor body 11'.

Referring to FIGS. 4, 5, and 6, an additional embodiment of the binary structure is shown wherein the source transistors previously associated with collector-up structures 36 and 46 may be omitted and additional PNP devices 61 and 66 are provided. PNP device 61 includes emitter 62, connected to voltage supply terminal 58, base region 63 connected to the common ground or semiconductor body, and collector 64 connected to collector 42 of collector-up device 41. Similarly, device 66 has an emitter 67 connected to voltage supply terminal 58, a base 68 connected to the common ground or semiconductor body and a collector 69 connected to a collector 52 of collector-up device 51. It is to be noted in operation that the respective devices 61 and 66 are source transistors providing current for the respective collector-up devices for improved switching operation.

Referring to FIGS. 5 and 6, it is to be noted that the first P type combination region including regions 48', 31' and 29' and the P type second combination region including regions 22' and 19' and 39' have been spaced from the respective N type regions 63' and 68'. Moreover, additional P type regions 64' and 69', formed simultaneously with the previously described combination regions and regions 43' and 53' have been added to the structure. P regions 69' is formed in body 11' and extends to surface 12'. The combination of regions 67' and 68' extends laterally to overlap a portion of region 69'. Similarly, P type region 64' is formed in body 11' extending to surface 12'. The combination of regions 62' and 63' extends laterally to overlap a portion of regions 64'. The respective PNP devices 61 and 66 thus formed have lead means and interconnecting means connected to the respective regions thereof to interpose respective transistors 61' and 66' as previously discussed in conjunction with the schematic diagram of FIG. 4.

Thus it is apparent that there has been provided an improved performance, collector-up logic semiconductor structure for performing binary circuit functions. It is further apparent that the present invention provides an improved semiconductor collector-up logic structure which may be formed in relatively high density arrays and which is capable of greatly improved switching speeds.

I claim:

1. In a collector-up binary circuit structure of the type utilizing vertical active devices the structure comprising, a semiconductor body of one conductivity type having a planar surface, spaced first, second, third and fourth vertical transistors formed in said body including opposite conductivity base regions formed in said body extending to said surface, and one conductivity collector regions formed in the respective base regions extending to said surface, said body forming the emitter region for said transistors, fifth, sixth, seventh and eighth vertical transistors, and fifth and sixth transistors formed in the base region of said second transistor including spaced one conductivity regions formed in said base region and extending to said surface, said second transistor base region forming the collectors of said fifth and sixth transistors, said spaced one conductivity regions forming the respective base regions of said fifth and sixth transistors, and opposite conductivity regions formed in the respective base regions of said fifth and sixth transistors extending to said surface to form the emitter regions of said fifth and sixth transistors, said seventh and eighth transistors formed in the base region of said fourth transistor including spaced one conductivity regions formed in said base region and extending to said surface, said base region forming the collectors of said seventh and eighth transistors, said spaced one conductivity regions forming the base regions of said seventh and eighth transistors, and opposite conductivity regions formed in the respective base regions of said seventh and eighth transistors and extending to said surface to form the emitter regions of said seventh and eighth transistors and interconnecting means for connecting said structure as a binary circuit having first and second voltage supply terminals, said interconnecting means including means for connecting the base regions of said fifth and seventh transistors to a binary input, connecting the base regions of said sixth and eighth transistors to the complement of said binary input, connecting the collector region of the said third transistor to the emitter regions of said sixth and eighth transistors, connecting the collector region of said fourth transistor to the base region of said third transistor, connecting the base regions of said first and third transistors and the collector regions of said fifth, sixth, seventh and eighth regions to the first terminal of a voltage supply and the semiconductor body to the second terminal of a voltage supply, connecting the collector of said seventh transistor, the collector of said second transistor and the base of said first transistor to the binary output terminal, connecting the collector of said fifth transistor and the collector of said first transistor to the binary complement output terminal, so that a binary circuit is provided.

2. A semiconductor structure as in claim 1 together with lead means for providing ohmic contact to each of the respective regions of each of the respective transistors.

3. A semiconductor structure as in claim 1 together with means formed in said semiconductor body for injecting the carriers into said first, second, third and fourth transistors.

4. A semiconductor structure as in claim 3 wherein said means includes source transistors formed in said body and associated with each of said first, second, third and fourth transistors.

5. A semiconductor structure as in claim 4 wherein said first, second, fifth and sixth transistors are positioned along a first line at said surface, said third, fourth, seventh and eighth transistor are positioned along a second line at said surface substantially parallel to said first line and together with spaced stripe source transistors formed at right angles to said first and second lined devices and overlapping said first and seventh and said fourth and sixth transistors.

6. A structure as in claim 5 together with ninth and tenth transistors interposed between said first terminal of said voltage supply, said ninth transistor including a one conductivity region formed in said body and extending to said surface, spaced from said collector region of said fifth and sixth transistors, said collector region forming the collector of said ninth transistor, the one conductivity region spacing said opposote conductivity region from the base region, and the opposite conductivity region connected to said first terminal of said voltage supply, the emitter region of said ninth transistor, and said tenth transistor.

* * * * *